US012784633B2

(12) United States Patent
Yun et al.

(10) Patent No.: US 12,784,633 B2
(45) Date of Patent: Nov. 3, 2026

(54) DIGITAL-TO-ANALOG CONVERTER AND DISPLAY DRIVING CIRCUIT INCLUDING THE SAME

(71) Applicants: LG Display Co., Ltd., Seoul (KR); Industry-University Cooperation Foundation Hanyang University, Seoul (KR)

(72) Inventors: Seongho Yun, Paju-si (KR); Byongdeok Choi, Seoul (KR); Inrae Park, Paju-si (KR); Haesang Park, Goyang-si (KR)

(73) Assignees: LG DISPLAY CO., LTD., Seoul (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 19/296,193

(22) Filed: Aug. 11, 2025

(65) Prior Publication Data

US 2026/0188163 A1 Jul. 2, 2026

(30) Foreign Application Priority Data

Dec. 30, 2024 (KR) ........................ 10-2024-0200929

(51) Int. Cl.
*G09G 3/20* (2006.01)
*G09G 3/30* (2006.01)
*H03M 1/70* (2006.01)

(52) U.S. Cl.
CPC ............ *G09G 3/2007* (2013.01); *H03M 1/70* (2013.01); *G09G 3/30* (2013.01); *G09G 2310/027* (2013.01); *G09G 2320/04* (2013.01)

(58) Field of Classification Search
None
See application file for complete search history.

(56) References Cited

U.S. PATENT DOCUMENTS

| | | | | |
|---|---|---|---|---|
| 10,665,169 | B2 * | 5/2020 | Chang | G09G 3/3266 |
| 11,545,100 | B2 * | 1/2023 | Yabuki | G09G 3/3614 |
| 2020/0410919 | A1 * | 12/2020 | Saeki | G09G 3/3688 |
| 2024/0153425 | A1 * | 5/2024 | Kwon | G09G 3/20 |

FOREIGN PATENT DOCUMENTS

| | | | |
|---|---|---|---|
| KR | 10-2008-0068428 | A | 7/2008 |
| KR | 10-2009-0093019 | A | 9/2009 |
| KR | 10-2096092 | B1 | 4/2020 |

* cited by examiner

*Primary Examiner* — Aneeta Yodichkas
(74) *Attorney, Agent, or Firm* — Birch, Stewart, Kolasch & Birch, LLP

(57) ABSTRACT

A digital-to-analog converter and a driving circuit of a display device including such converter are discussed. The digital-to-analog converter can include a decoder configured to select one of a plurality of gamma voltages corresponding to a grayscale value of image data and output the selected gamma voltage to an output terminal, and a slew rate controller connected to the output terminal of the decoder. The slew rate controller includes a pull-up transistor connected between a high-potential voltage and the output terminal, with a gate electrode configured to receive a first slew rate control signal, and a pull-down transistor connected between a low-potential voltage and the output terminal, with a gate electrode configured to receive a second slew rate control signal.

20 Claims, 14 Drawing Sheets

DIGITAL-TO-ANALOG CONVERTER AND DISPLAY DRIVING CIRCUIT INCLUDING THE SAME

CROSS-REFERENCE TO RELATED APPLICATION

The present application claims priority to Korean Patent Application No. 10-2024-0200929, filed in the Republic of Korea on Dec. 30, 2024, the entire contents of which is hereby expressly incorporated by reference into the present application.

BACKGROUND OF THE DISCLOSURE

Field

The present disclosure relates to a digital-to-analog converter and a driving circuit of a display device including the same.

Discussion of the Related Art

A display device includes a driving circuit for displaying image data on a display panel. The driving circuit includes a data driver that provides image data to a plurality of pixels arranged in the display panel through data lines. The data driver can convert one of a plurality of gamma voltages generated by a gamma voltage generator into a data voltage based on the image data and output it to the data lines.

As the display device increases in size and the load on the data lines grows, the slew rate of the data voltage output from the data driver can gradually increase. If the slew rate of the data voltage increases, the data voltage applied to the data lines may not reach the required voltage within the output period, which can lead to image quality degradation.

SUMMARY OF THE DISCLOSURE

It is an object of the embodiments of the present disclosure to provide a digital-to-analog converter and a driving circuit of a display device including the same, which are capable of improving the slew rate of a data driver.

It is another object of the embodiments of the present disclosure to provide a digital-to-analog converter and a driving circuit of a display device including the same, which are capable of improving the slew rate by disposing a slew rate controller at the output stage of the digital-to-analog converter.

It is another object of the embodiments of the present disclosure to provide a digital-to-analog converter, a driving circuit including the same, and a display device including the driving circuit, which address limitations and disadvantages associated with the related art.

It is still another object of the embodiments of the present disclosure to provide a digital-to-analog converter and a driving circuit of a display device including the same, which are capable of improving the slew rate by equipping the digital-to-analog converter with a slew rate controller that includes a pull-up transistor connected between a high-potential voltage and the output stage and a pull-down transistor connected between a low-potential voltage and the output stage to supply a charging current or a discharging current to the output stage.

A digital-to-analog converter according to an embodiment of the present disclosure can include a decoder configured to select one of a plurality of gamma voltages corresponding to a grayscale value of image data and output the selected gamma voltage to an output terminal, and a slew rate controller connected to the output terminal of the decoder.

According to aspects of the present disclosure, the slew rate controller can include a pull-up transistor connected between a high-potential voltage and the output terminal, with a gate electrode configured to receive a first slew rate control signal, and a pull-down transistor connected between a low-potential voltage and the output terminal, with a gate electrode configured to receive a second slew rate control signal.

According to aspects of the present disclosure, the pull-up transistor and the pull-down transistor can be controlled to be turned on or off based on the grayscale value of the image data to generate a charging current and a discharging current, respectively.

According to aspects of the present disclosure, the slew rate controller can further include a pull-up switching element connected between the high-potential voltage and the pull-up transistor, and a pull-down switching element connected between the low-potential voltage and the pull-down transistor.

According to aspects of the present disclosure, the pull-up switching element can be turned on based on the grayscale value being within a first grayscale range, the pull-down switching element can be turned on based on the grayscale value being within a second grayscale range, the first grayscale range can include grayscale values greater than a predetermined threshold among all grayscale values, and the second grayscale range can include grayscale values less than the predetermined threshold among all grayscale values.

According to aspects of the present disclosure, upon the pull-up switching element being turned on, the charging current can be applied to the output terminal through the pull-up transistor in a turned-on state, and upon the pull-down switching element being turned on, the discharging current can be leaked from the output terminal through the pull-down transistor in a turned-on state.

According to aspects of the present disclosure, the pull-up switching element can include a transistor connected between the high-potential voltage and the pull-up transistor, and configured to be turned on in the first grayscale range, and the pull-down switching element can include a transistor connected between the low-potential voltage and the pull-down transistor, and configured to be turned on in the second grayscale range.

According to aspects of the present disclosure, the first slew rate control signal and the second slew rate control signal can vary in correspondence with the grayscale value.

According to aspects of the present disclosure, the slew rate controller can further include a first slew rate control signal generator configured to generate the first slew rate control signal, and a second slew rate control signal generator configured to generate the second slew rate control signal.

According to aspects of the present disclosure, the first slew rate control signal generator can include a plurality of first switching elements respectively connected between a plurality of input voltages having different voltage levels and an output terminal of the first slew rate control signal, and the second slew rate control signal generator can include a plurality of second switching elements respectively connected between a plurality of input voltages having different voltage levels and an output terminal of the second slew rate control signal, the plurality of first switching elements and the plurality of second switching elements being controlled to be selectively turned on based on the grayscale value of the image data.

According to aspects of the present disclosure, the plurality of input voltages can include at least one of the high-potential voltage, the low-potential voltage, and the plurality of gamma voltages.

According to aspects of the present disclosure, the slew rate controller can further include a pull-up switching element connected between the high-potential voltage and the pull-up transistor, a pull-down switching element connected between the low-potential voltage and the pull-down transistor, a first slew rate control signal generator configured to generate the first slew rate control signal, and a second slew rate control signal generator configured to generate the second slew rate control signal.

According to aspects of the present disclosure, the first slew rate control signal and the second slew rate control signal can have a voltage level corresponding to one of the plurality of gamma voltages.

According to aspects of the present disclosure, the slew rate controller can include a first slew rate controller including a first pull-up transistor and a first pull-down transistor, and a second slew rate controller connected in parallel with the first slew rate controller, and including a second pull-up transistor and a second pull-down transistor.

According to aspects of the present disclosure, the first slew rate controller can further include a first pull-up switching element connected between the high-potential voltage and the pull-up transistor and a first pull-down switching element connected between the low-potential voltage and the pull-down transistor, and the second slew rate controller further can further include a second pull-up switching element connected between the high-potential voltage and the pull-up transistor and a second pull-down switching element connected between the low-potential voltage and the pull-down transistor.

According to aspects of the present disclosure, upon the grayscale value being within a first grayscale range, the first pull-up switching element and the first pull-down switching element can be turned on, upon the grayscale value being within a second grayscale range, the second pull-up switching element and the second pull-down switching element can be turned on, the first grayscale range can include grayscale values greater than a predetermined threshold among all grayscale values, and the second grayscale range can include grayscale values less than the predetermined threshold among all grayscale values.

A driving circuit of a display device according to an embodiment of the present disclosure can include a register configured to sequentially sample and output bits of image data received from a timing controller, a latch configured to latch and output the image data received from the register, a gamma voltage generator configured to divide a gamma reference voltage to generate a plurality of gamma voltages, and a digital-to-analog converter configured to select one of the plurality of gamma voltages corresponding to a grayscale value of the image data and output the selected gamma voltage through an output terminal.

According to aspects of the present disclosure, the digital-to-analog converter can include a decoder configured to select one of the plurality of gamma voltages corresponding to the grayscale value of the image data and output the selected gamma voltage to the output terminal, and a slew rate controller connected to the output terminal of the t decoder.

According to aspects of the present disclosure, the slew rate controller can include a pull-up transistor connected between a high-potential voltage and the output terminal, with a gate electrode configured to receive a first slew rate control signal, and a pull-down transistor connected between a low-potential voltage and the output terminal, with a gate electrode configured to receive a second slew rate control signal, wherein the pull-up transistor and the pull-down transistor can be controlled to turn on and off based on the grayscale value of the image data to generate a charging current and a discharging current, respectively.

According to aspects of the present disclosure, the slew rate controller can further include a pull-up switching element connected between the high-potential voltage and the pull-up transistor, and a pull-down switching element connected between the low-potential voltage and the pull-down transistor.

According to aspects of the present disclosure, the first slew rate control signal and the second slew rate control signal can vary in correspondence with the grayscale value.

According to aspects of the present disclosure, the slew rate controller can further include a first slew rate control signal generator configured to generate the first slew rate control signal, and a second slew rate control signal generator configured to generate the second slew rate control signal.

According to aspects of the present disclosure, the first slew rate control signal generator can include a plurality of first switching elements respectively connected between a plurality of input voltages having different voltage levels and an output terminal of the first slew rate control signal, and the second slew rate control signal generator can include a plurality of second switching elements respectively connected between a plurality of input voltages having different voltage levels and an output terminal of the second slew rate control signal, the plurality of first switching elements and the plurality of second switching elements being controlled to be selectively turned on based on the grayscale value of the image data.

According to aspects of the present disclosure, the slew rate controller can include a first slew rate controller including a first pull-up transistor and a first pull-down transistor, and a second slew rate controller connected in parallel with the first slew rate controller, and including a second pull-up transistor and a second pull-down transistor.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

FIG. 6 is a diagram for explaining the grayscale range in which the switching elements in FIG. 4 are turned on;

FIG. 13 is a diagram for explaining the grayscale range in which the switching elements in FIG. 12 are turned on.

DETAILED DESCRIPTION OF THE EMBODIMENTS

Figure 1:
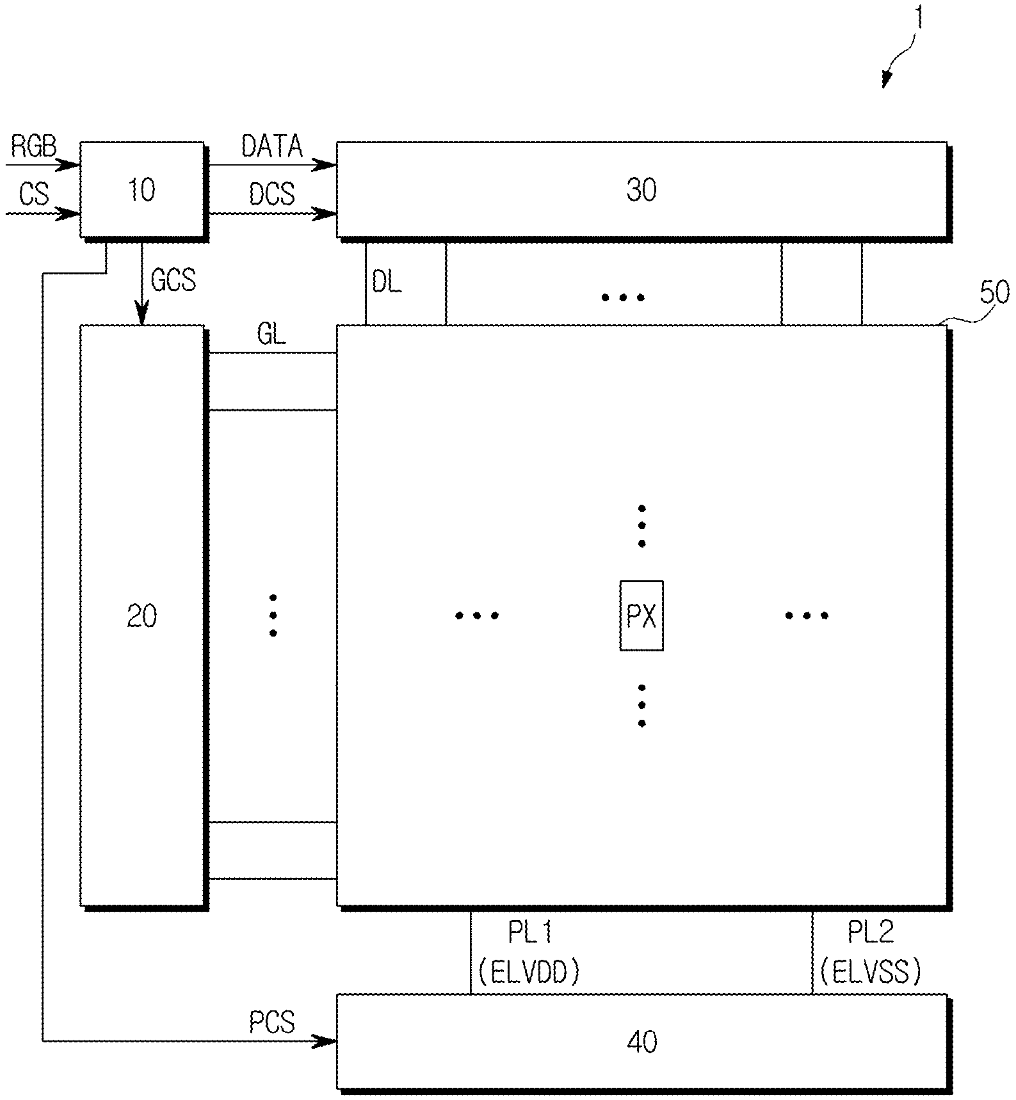
FIG. 1 is a block diagram illustrating the configuration of a display device according to one or more embodiments of the present disclosure.

Hereinafter, embodiments of the present disclosure will be described with reference to accompanying drawings. In the specification, when a component (or area, layer, part, etc.) is mentioned as being "on top of," "connected to," or "coupled to" another component, it means that it can be directly connected/coupled to the other component, or a third component can be placed between them.

The same reference numerals refer to the same components. In addition, in the drawings, the thickness, proportions, and dimensions of the components are exaggerated for effective description of the technical content. The expression "and/or" is taken to include one or more combinations that can be defined by associated components.

The terms "first," "second," etc. are used to describe various components, but the components should not be limited by these terms. The terms are used only for distinguishing one component from another component. For example, a first component can be referred to as a second component and, similarly, the second component can be referred to as the first component, without departing from the scope of the present disclosure. The singular forms are intended to include the plural forms as well unless the context clearly indicates otherwise.

The terms such as "below," "lower," "above," "upper," etc. are used to describe the relationship of components depicted in the drawings. The terms are relative concepts and are described based on the direction indicated on the drawing.

It will be further understood that the terms "comprises," "has," and the like are intended to specify the presence of stated features, numbers, steps, operations, components, parts, or a combination thereof but are not intended to preclude the presence or possibility of one or more other features, numbers, steps, operations, components, parts, or combinations thereof. Further, the term "can" fully encompasses all the meanings and coverages of the term "may" and vice versa.

Now referring to the drawings, various embodiments of the present disclosure will be discussed. All the components of each display device according to all embodiments of the present disclosure are operatively coupled and configured.

FIG. 1 is a block diagram illustrating a configuration of a display device according to one or more embodiments of the present disclosure.

Referring to FIG. 1, a display device 1 can include a display panel 50 and a driving circuit. The driving circuit can include a timing controller 10, a gate driver 20, a data driver 30, and a power supply unit 40.

The timing controller 10 can control the operation timing of the gate driver 20 and the data driver 30. The timing controller 10 can receive video signals RGB and control signals CS from external host systems or the like. The video signals can include a plurality of grayscale data. The control signals CS can include a horizontal sync signal, a vertical sync signal, and a main clock signal.

The timing controller 10 processes the image signal RGB and the control signal CS to match the operating conditions of the display panel 50, and generates and outputs image data DATA, gate drive control signal GCS, data drive control signal DCS, and power supply control signal PCS.

The gate driver 20 generates gate signals based on the gate drive control signal GCS input from the timing controller 10. The gate drive control signal GCS can include, for example, a gate start signal, a gate shift clock, and so on, but is not limited to these.

The gate driver 20 provides the generated gate signals to the pixels PX through the plurality of gate lines GL. In one embodiment of the present disclosure, a single pixel PX can be configured to receive a plurality of gate signals with different waveforms. In this case, the gate driver 20 can provide the plurality of gate signals to the pixels PX through the corresponding gate lines GL.

The gate driver 20 can be configured in a Gate In Panel (GIP) form, implemented on the display panel 50. The gate driver 20 can be disposed on one side of the display panel 50 or, as shown in the drawing, on both sides (e.g., left and right) of the display panel 50. Depending on the driving method, panel design method, etc., the gate driver 20 can be disposed on both sides (e.g., left and right) of the display panel 50, as shown in the drawing, or can be connected to two or more of the four sides of the display panel 50.

The data driver 30 can generate data signals based on the image data DATA and data drive control signal DCS output from the timing controller 10. The data drive control signal DCS can include, for example, a source start pulse, a source sampling clock, and a source output enable signal, but is not limited thereto. The data driver 30 can provide the generated data signals to the pixels PX through a plurality of data lines DL.

The data driver 30 can be composed of one or more source driver integrated circuits. Each source driver integrated circuit can be mounted on a source printed circuit board and bonded to one side of the display panel 50. Each source driver integrated circuit can be connected to the data lines DL through one or more output channels.

The power supply unit 40 can generate the high-potential driving voltage ELVDD and low-potential driving voltage ELVSS to be provided to the display panel 50 based on the power supply control signal PCS. The power supply unit 40 can provide the generated driving voltages ELVDD and ELVSS to the pixels PX through the corresponding voltage lines PL1 and PL2.

The display panel 50 includes a plurality of pixels PX (or sub-pixels) arranged thereon. The pixels PX can be arranged, for example, in a matrix form on the display panel 50. The pixels PX arranged in one pixel row are connected to the same gate line GL, and the pixels PX arranged in one pixel column are connected to the same data line DL. The pixels can emit light corresponding to the brightness of the gate signals and data signals supplied through the gate lines GL and data lines DL.

In one embodiment of the present disclosure, each pixel PX can display one of the colors, red, green, or blue. In another embodiment of the present disclosure, each pixel PX can display one of the colors, cyan, magenta, or yellow. In various embodiments of the present disclosure, each pixel PX can display one of the colors, red, green, blue, or white.

Figure 2:
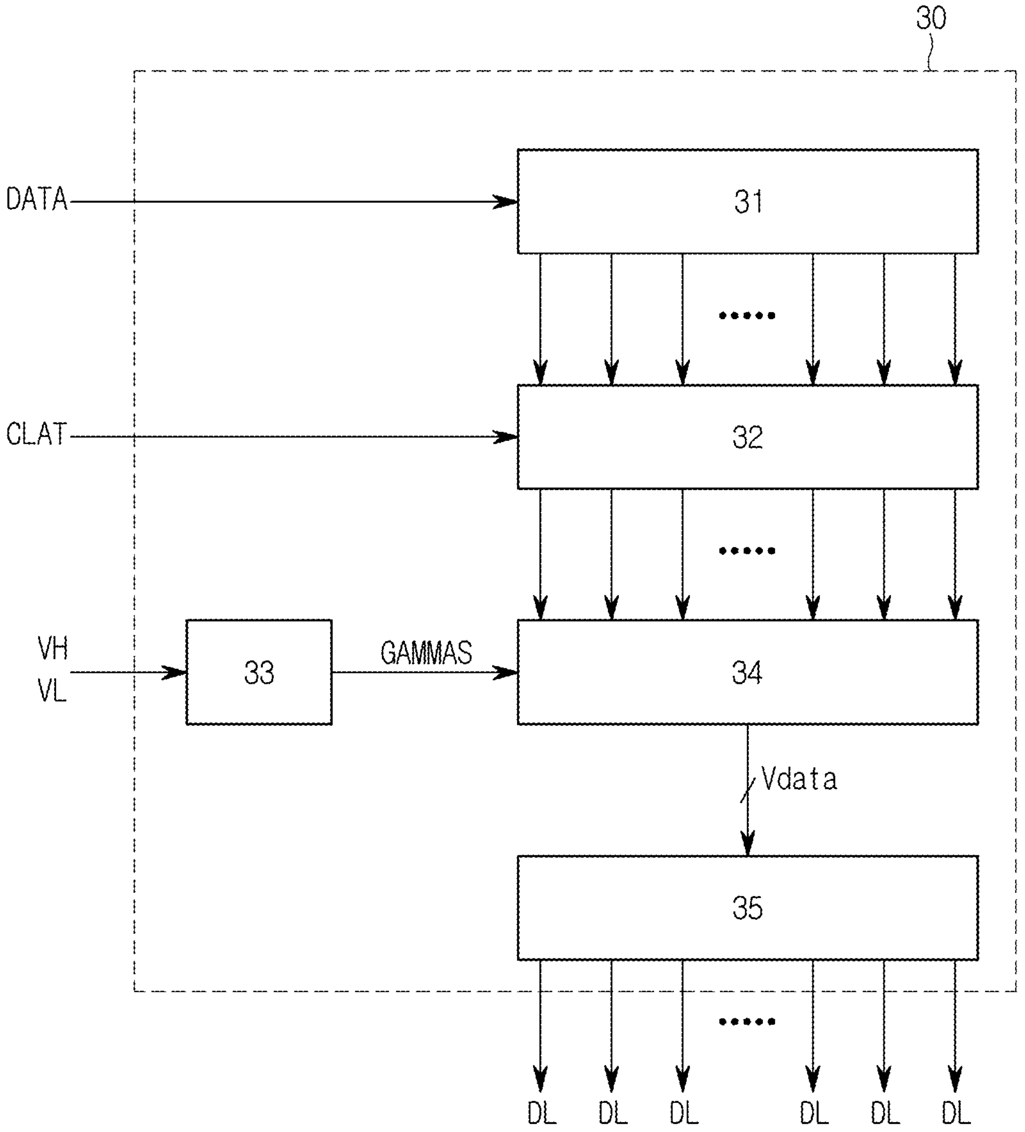
FIG. 2 is a block diagram illustrating the configuration of a data driver according to an embodiment of the present disclosure.

FIG. 2 is a block diagram illustrating the configuration of a data driver according to an embodiment of the present disclosure.

Referring to FIG. 2, the data driver 30 can include a register 31, a latch 32, a gamma voltage generator 33, a digital-to-analog converter 34, and an output buffer 35.

The register 31 can sequentially sample and output the bits of the image data DATA received from the timing controller 10 (FIG. 1). The image data DATA can be binary digital data composed of n bits. Here, the first bit of the image data DATA is referred to as the nth bit, and the last bit of the image data DATA is referred to as the first bit. For example, when the image data DATA consists of 2 bits, the maximum value '11'can represent the highest grayscale, and the minimum value '00'can represent the lowest grayscale. For example, when the nth bit of the image data DATA is '1', the image data DATA can fall in the high grayscale range, and when the nth bit is '0', the image data DATA can fall in the low grayscale range. Here, the high grayscale range is the range that includes grayscale values greater than a set threshold among all the grayscale values, and the low grayscale range is the range that includes grayscale values smaller than a set threshold.

The latch 32 can latch one horizontal line unit of image data DATA input from the register 31 and, in synchronization with the latch output control signal CLAT received from the timing controller 10, can simultaneously output the bits of the image data DATA for one horizontal line unit.

The gamma voltage generator 33 can divide the gamma reference voltages VH and VL supplied from an external source to generate a plurality of gamma voltages GAMMAS. The gamma voltage generator 33 can include a voltage divider circuit composed of a plurality of resistive strings connected in series and divide the gamma reference voltages VH and VL into a plurality of gamma voltages GAMMAS through the voltage divider circuit.

The digital-to-analog converter 34 can receive the gamma voltages GAMMAS from the gamma voltage generator 33.

The digital-to-analog converter 34 can convert the image data DATA received from the latch 32 into corresponding gamma voltages to generate a data voltage Vdata.

The output buffer 35 can buffer the data voltage Vdata output from the digital-to-analog converter 34, amplify it, and output it to the corresponding data lines DL through each channel.

Figure 3:
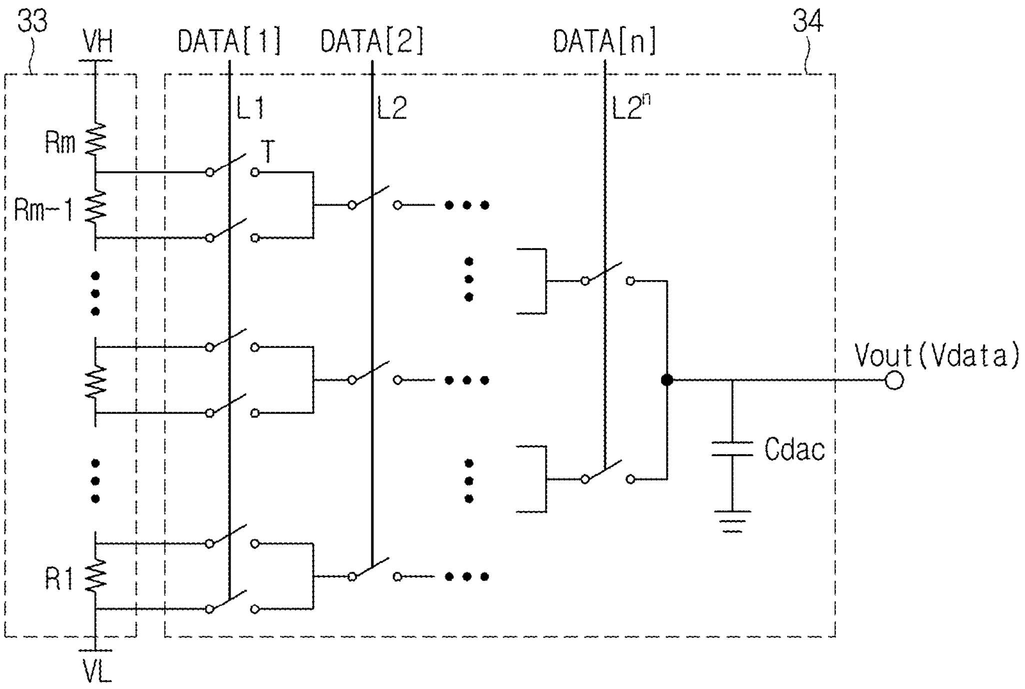
FIG. 3 is an equivalent circuit illustrating a portion of the data driver of FIG. 2.

FIG. 3 is an equivalent circuit illustrating a portion of the data driver of FIG. 2. Specifically, FIG. 3 illustrates the equivalent circuit of the gamma voltage generator 33 and the digital-to-analog converter 34 shown in FIG. 2.

Referring to FIG. 3, the gamma voltage generator 33 receives the upper gamma reference voltage VH and the lower gamma reference voltage VL as inputs, and includes a voltage divider circuit that divides the voltage between the upper gamma reference voltage VH and the lower gamma reference voltage VL to generate multiple gamma voltages. The voltage divider circuit can consist of a series of resistors R1 to Rm connected in series between the upper gamma reference voltage VH and the lower gamma reference voltage VL. In the illustrated embodiment of the present disclosure, the gamma voltage generator 33 can include m resistors R1 to Rm to generate m gamma voltages.

The digital-to-analog converter 34 can include 2n input lines L1 to L**2*n* for processing n-bit image data DATA, and a plurality of switching elements T that are enabled via these 2n input lines L1 to L2*n*, where n can be a real number such as a natural number. The nodes between the plurality of resistors R are connected hierarchically in a tree-like structure. Accordingly, m switching elements T can be connected to the first input line L1, m/2 switching elements T can be connected to the second input line L2, and 2 switching elements T can be connected to the 2n-th input line L2*n***.

This structure selects m/2 gamma voltages from the m gamma voltages based on the first bit DATA [1] of the image data DATA, selects m/4 gamma voltages from the m/2 gamma voltages based on the second bit DATA [2] of the image data DATA, and finally selects 1 gamma voltage from the 2 selected gamma voltages based on the nth bit DATA[n] of the image data DATA.

The two switching elements T connected to the same input line L1 through L**2*n*** and electrically linked can be configured so that only one of them turns on in correspondence with the bit value of the image data DATA. For example, when the bit value of the image data DATA is 1, the switching element T that outputs the higher divided voltage can turn on, while the other switching element T is turned off. Similarly, when the bit value of the image data DATA is 0, the switching element T that outputs the lower divided voltage can turn on, and the other switching element T can turn off.

To this end, in one embodiment of the present disclosure, the switching element T can be composed of a transistor. The pair of switching elements T can be configured with transistors of different types. For example, one switching element T in the pair can be an N-type transistor, and the other can be a P-type transistor.

A capacitor Cdac can also be included at the output terminal of the digital-to-analog converter 34 to stabilize the output voltage Vout.

In this embodiment, the data voltage Vdata output from the digital-to-analog converter 34 can have a predetermined slew rate and reach the required voltage after a specific delay time. The slew rate of the data voltage Vdata can increase due to various factors, such as an increase in the number of bits of the image data DATA (i.e., an increase in color depth), an increase in the number of switching elements T corresponding to the increase in bits of the image data DATA, an increase in parasitic capacitance caused by the switching elements T, and an increase in the number of channels connected to the digital-to-analog converter 34 (load increase). When the slew rate of the data voltage Vdata increases, the data voltage Vdata can fail to reach the required voltage value within the desired time, leading to a degradation in image quality.

To address this issue, the digital-to-analog converter 34 according to one embodiment of the present disclosure can further include a slew rate controller. The configuration of the digital-to-analog converter 34 including the slew rate controller will be described in more detail below.

Figure 4:
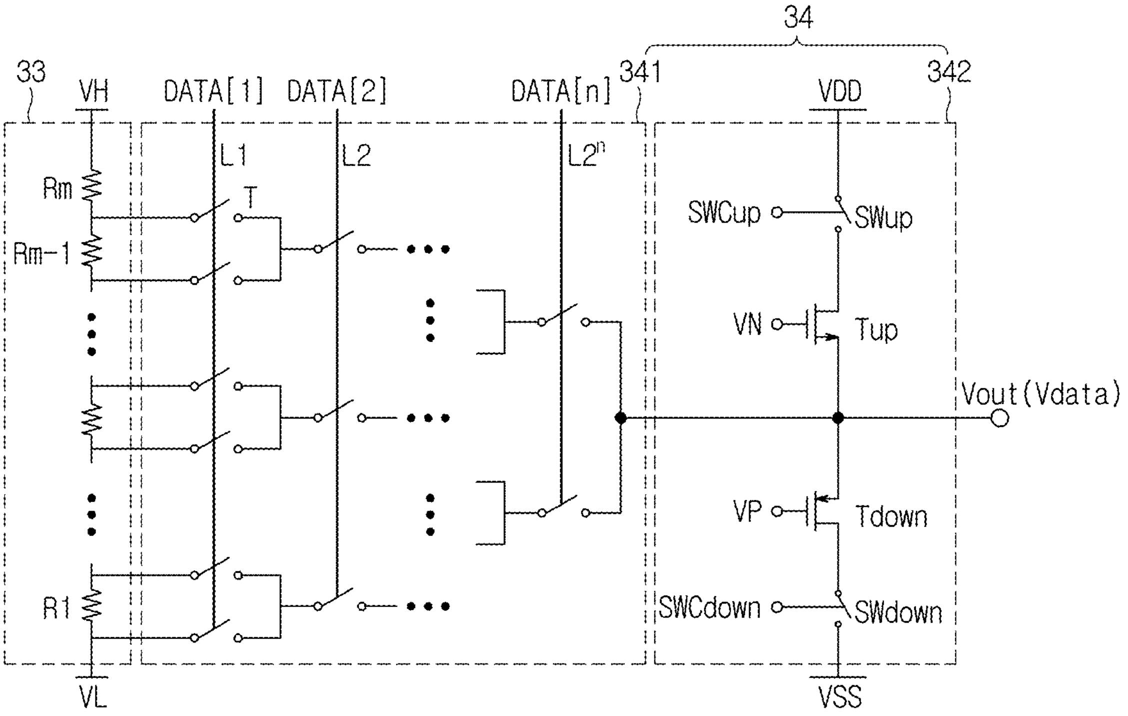
FIG. 4 is a diagram illustrating the structure of a slew rate controller according to a first embodiment of the present disclosure.
Figure 5:
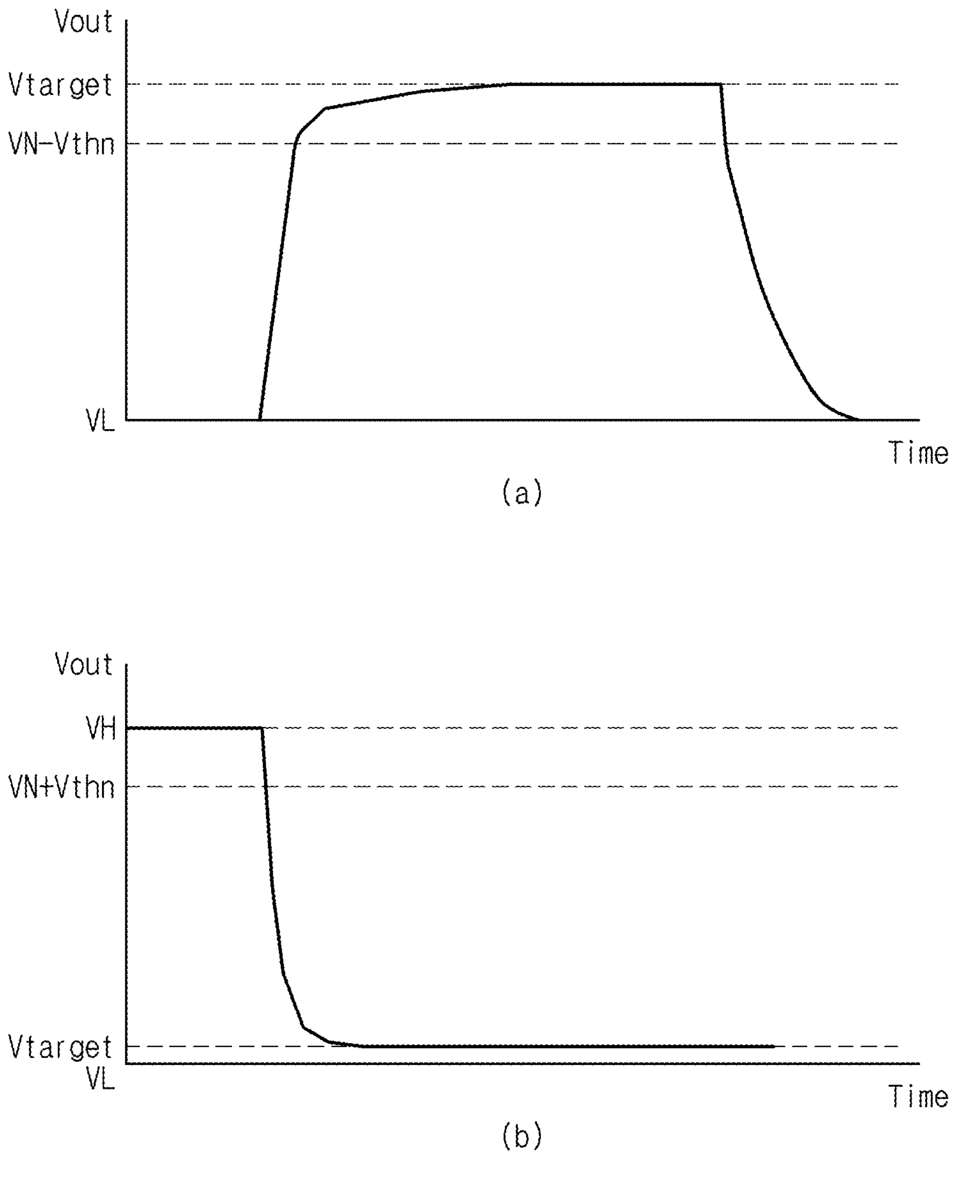
FIG. 5 shows diagrams illustrating input and output signals of a digital-to-analog converter in FIG. 4.
Figure 6:
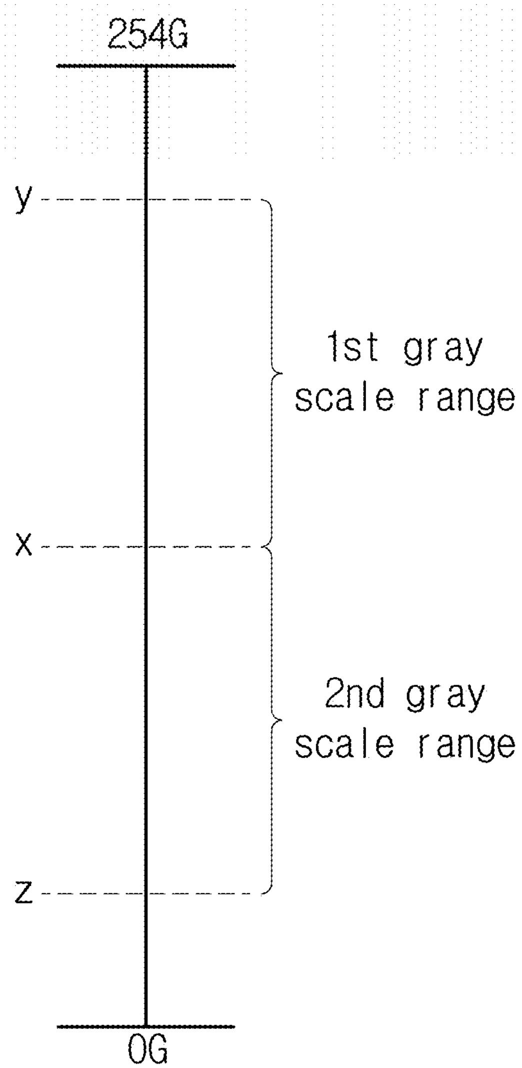
Figure 7:
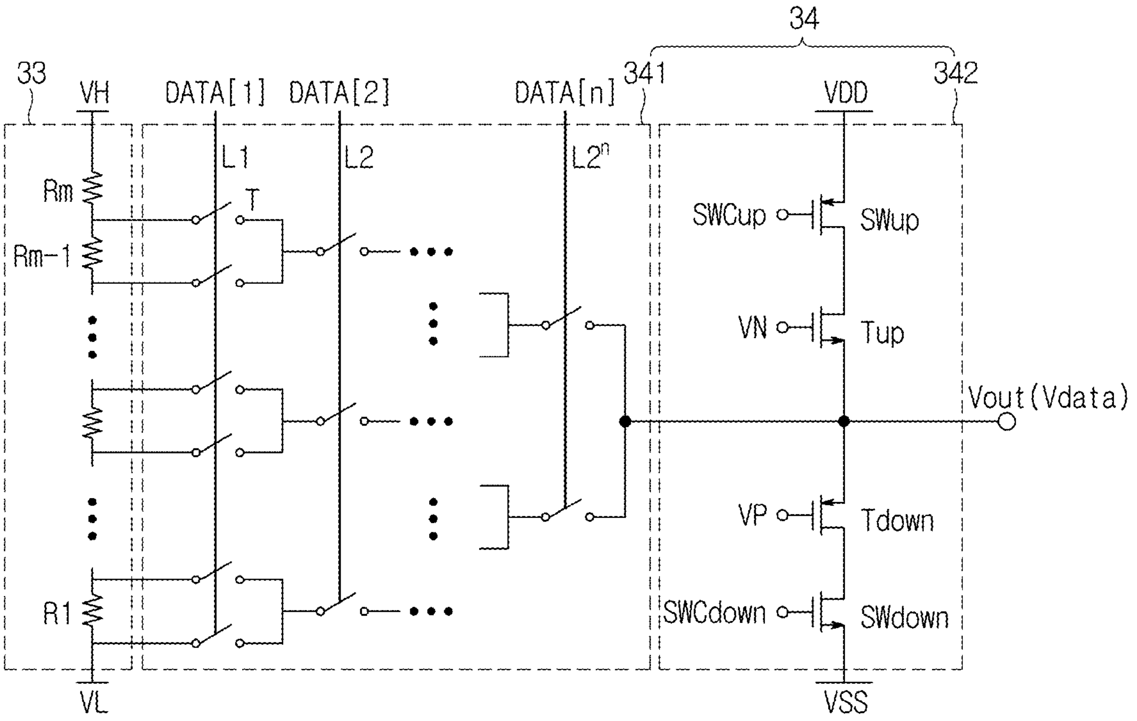
FIG. 7 is a diagram illustrating the switching elements in FIG. 4 being configured as transistors according to an embodiment of the present disclosure.

FIG. 4 is a diagram illustrating the structure of a slew rate controller according to a first embodiment of the present disclosure, FIG. 5 shows diagrams illustrating input and output signals of a digital-to-analog converter in FIG. 4, FIG. 6 is a diagram for explaining the grayscale range in which the switching elements in FIG. 4 are turned on, and FIG. 7 is a diagram illustrating the switching elements in FIG. 4 being configured as transistors according to an embodiment of the present disclosure.

Referring to FIG. 4, the digital-to-analog converter 34 can include a decoder 341, which selects and outputs one of the plurality of gamma voltages outputted from the gamma voltage generator 33, and a slew rate controller 342, which is connected to the output terminal of the decoder 341, controls the slew rate of the selected gamma voltage, and outputs it to the data line.

The slew rate controller 342 can include a pull-up transistor Tup connected between the high-potential voltage VDD and the output terminal, and a pull-down transistor Tdown connected between the output terminal and the low-potential voltage VSS.

The pull-up transistor Tup is connected between the high-potential voltage VDD and the output terminal. The gate electrode of the pull-up transistor Tup can be configured to receive the first slew rate control signal VN. The pull-up transistor Tup can turn on according to the first slew rate control signal VN, electrically connecting the high-potential voltage VDD and the output terminal. Here, the first slew rate control signal VN can correspond to the gamma voltage level corresponding to the grayscale value indicated by the image data DATA.

Referring to (a) of FIG. 5, the pull-up transistor Tup can turn on when the gate-source voltage VN−Vout is greater than the threshold voltage Vthn of the pull-up transistor Tup (Vout<VN−Vthn), generating a predetermined charging current flowing from the high-potential voltage VDD to the output terminal. Here, the gate voltage of the pull-up transistor Tup is controlled by the first slew rate control signal VN, and the source voltage is determined by the output voltage Vout of the decoder 341. The charging current generated by the pull-up transistor Tup charges the output terminal, causing the output voltage Vout to increase more rapidly toward the required voltage. As the output voltage Vout increases and the gate-source voltage VN−Vout reaches the threshold voltage Vthn of the pull-up transistor Tup, the pull-up transistor Tup turns off, and the output voltage Vout can be stably maintained at the target voltage Vtarget.

In one embodiment of the present disclosure, the pull-up transistor Tup can be an N-type transistor, but is not limited thereto.

The pull-down transistor Tdown is connected between the output terminal and the low-potential voltage VSS. The gate electrode of the pull-down transistor Tdown is configured to receive the second slew rate control signal VP. The pull-down transistor Tdown can turn on according to the second slew rate control signal VP, electrically connecting the low-potential voltage VSS and the output terminal. Here, the second slew rate control signal VP can correspond to the gamma voltage level corresponding to the grayscale value indicated by the image data (DATA).

Referring to (b) of FIG. 5, the pull-down transistor Tdown can turn on when the source-gate voltage (Vout−VP) is greater than the threshold voltage Vthp of the pull-down transistor Tdown (Vout>VP+Vthp), generating a predetermined discharge current flowing from the output terminal to the low-potential voltage VSS. Here, the gate voltage of the pull-down transistor Tdown is controlled by the second slew rate control signal VP, and the source voltage is determined by the output voltage Vout of the decoder 341. The discharge current generated by the pull-down transistor Tdown discharges the output terminal, causing the output voltage Vout to decrease more rapidly toward the required voltage. As the output voltage Vout increases and the source-gate voltage (Vout−VP) reaches the threshold voltage Vthp of the pull-down transistor Tdown, the pull-down transistor Tdown turns off, and the output voltage Vout can be stably maintained at the target voltage.

In one embodiment of the present disclosure, the pull-down transistor Tdown can be a P-type transistor, but is not limited thereto.

In the slew rate controller 342 according to the first embodiment, the slew rate control signals VN and VP can have fixed voltage levels corresponding to the gamma voltage. However, in other embodiments of the present disclosure, the slew rate control signals VN and VP can have variable values. These embodiments of the present disclosure will be described later in more detail.

The first embodiment of the slew rate controller 342 can further include switching elements Swup and SWdown that are connected between the high-potential voltage VDD and the pull-up transistor Tup, and between the low-potential voltage VSS and the pull-down transistor Tdown, respectively. The switching elements Swup and SWdown can be controlled to turn on and off in response to switching control signals SWCup and SWCdown.

The switching control signals SWCup and SWCdown can be applied to turn on or off the switching elements Swup and SWdown based on the grayscale value indicated by the image data DATA. The switching control signals SWCup and SWCdown can be configured to turn on the switching elements Swup and SWdown when the grayscale value of the image data DATA is within a predetermined grayscale range. Specifically, the pull-up switching control signal SWCup can control the pull-up switching element SWup to turn on when the grayscale value of the image data DATA is within the first grayscale range, for example, the high-grayscale range. Additionally, the pull-down switching control signal SWCdown can control the pull-down switching element SWdown to turn on when the grayscale value of the image data DATA is within the second grayscale range, for example, the low-grayscale range.

Referring to FIG. 6, the pull-up switching element SWup can turn on when the grayscale value indicated by the image data DATA is within the first grayscale range. Here, the first grayscale range can be the high-grayscale range. For example, the first grayscale range can include a range that is greater than the first grayscale value x and smaller than the second grayscale value y within the entire grayscale range (for example, OG to 254 G). Here, the first grayscale value x can be the middle grayscale value (127 G) within the entire grayscale range (OG to 254 G), and the second grayscale value y can be any grayscale value between the highest grayscale value (254 G) or the middle grayscale value (511 G) and the highest grayscale value (254 G).

When the pull-up switching element SWup turns on, the pull-up transistor Tup is electrically connected to the high-potential voltage VDD. When charging current is applied from the high-potential voltage VDD to the output terminal through the turned-on pull-up transistor Tup, the output voltage Vout can increase rapidly to a high voltage corresponding to the high grayscale.

In the embodiment of the present disclosure, the pull-up switching element Swup can prevent or reduce leakage current flowing from the high-potential voltage VDD through the pull-up switching element SWup in an unnecessary grayscale range.

The pull-down switching element SWdown can turn on when the grayscale value indicated by the image data DATA falls within the second grayscale range. The second grayscale range can correspond to the low grayscale range. For example, the second grayscale range can include a range smaller than the first grayscale value x and larger than the third grayscale value z in the entire grayscale range (OG to 254 G). Here, the first grayscale value x is the middle grayscale value (127 G) within the entire grayscale range (OG to 254 G), and the third grayscale value z is either the lowest grayscale value (OG) or any arbitrary grayscale value between the lowest grayscale value (OG) and the middle grayscale value (511 G).

When the pull-down switching element SWdown turns on, the pull-down transistor Tdown is electrically connected to the low-potential voltage VSS. When the discharge current is applied from the output terminal to the low-potential voltage VSS through the turned-on pull-down transistor Tdown, the output voltage Vout can decrease rapidly to a low voltage corresponding to the low grayscale.

Meanwhile, in the embodiment of the present disclosure, the pull-down switching element SWdown can prevent or reduce leakage current flowing from the output terminal to the low-potential voltage VSS through the pull-down switching element SWdown in an unnecessary grayscale range.

In one embodiment of the present disclosure, the switching control signals SWCup and SWCdown can be transmitted as a single packet along with the image data DATA. For example, the switching control signals SWCup and SWCdown can be transmitted through the most significant bit MSB of the packet in which the image data DATA is transmitted. At this time, the first MSB D[9], FIG. 7 can include the pull-up switching control signal SWCup for controlling the pull-up switching element SWup, and the second MSB D[8], FIG. 7 can include the pull-down switching control signal SWCdown for controlling the pull-down switching element SWdown. When the bit has a '1'value, the N-type transistor can turn on, and the P-type transistor can turn off. When the bit has a '0'value, the N-type transistor can turn off, and the P-type transistor can turn on. The bit values of these switching control signals SWCup and SWCdown can be determined according to the grayscale values of the image data DATA.

Referring to FIG. 7, in one embodiment of the present disclosure, the switching elements SWup and SWdown can be composed of transistors.

The pull-up switching element SWup can be connected between the high-potential voltage VDD and the pull-up transistor Tup, with the gate electrode configured to receive the pull-up switching control signal SWCup. The pull-down switching element SWdown D[9] can be connected between the low-potential voltage VSS and the pull-down transistor Tdown, with the gate electrode configured to receive the pull-down switching control signal SWCdown D[8]. In this embodiment of the present disclosure, the pull-up switching element SWup and the pull-down switching element SWdown can be composed of the same or different types of transistors. For example, as illustrated, the pull-up switching element SWup can be a P-type transistor, and the pull-down switching element SWdown can be an N-type transistor, but are not limited thereto.

Figure 8:
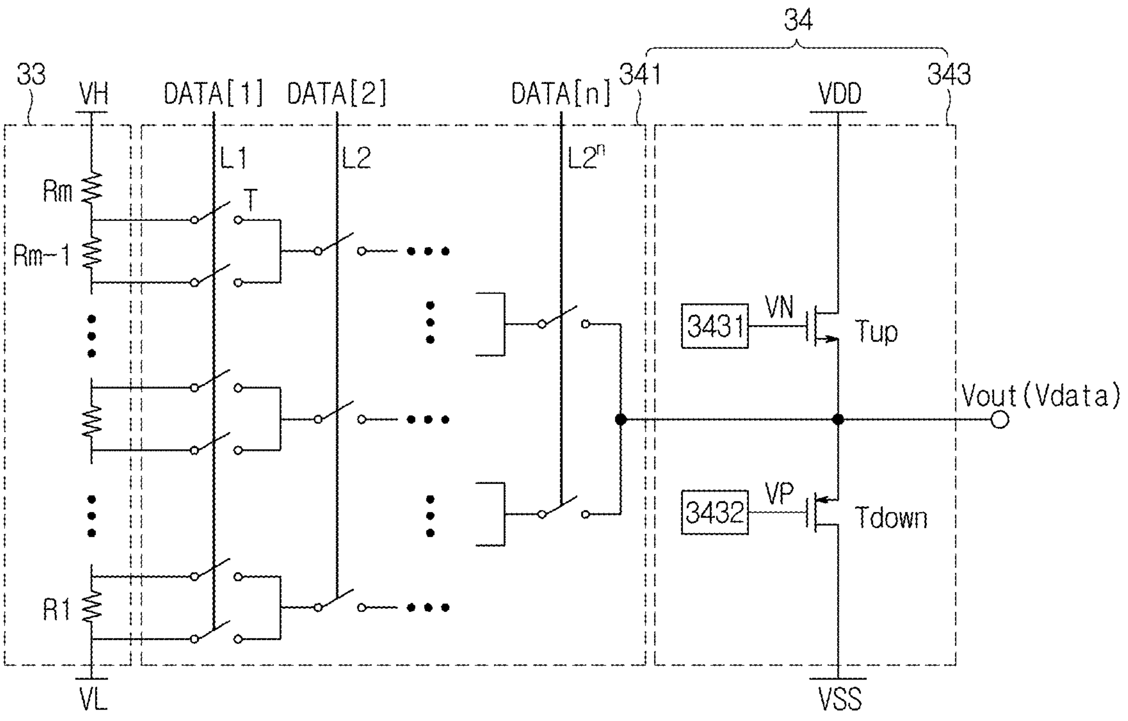
FIG. 8 is a diagram illustrating the structure of a slew rate controller according to a second embodiment of the present disclosure.
Figure 9:
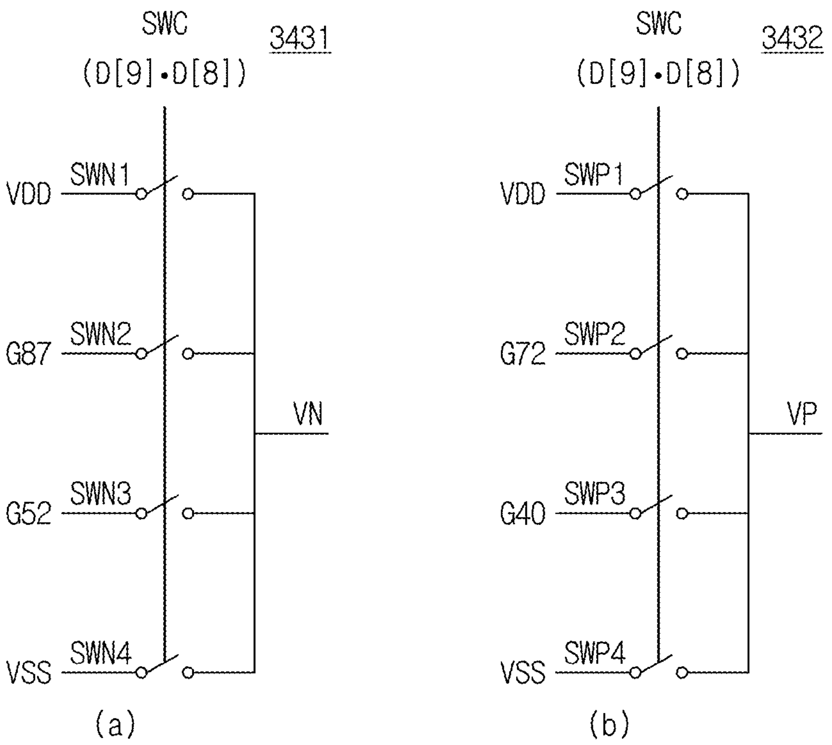
FIG. 9 is a diagram illustrating the structure of the slew rate control signal generator in FIG. 8.
Figure 10:
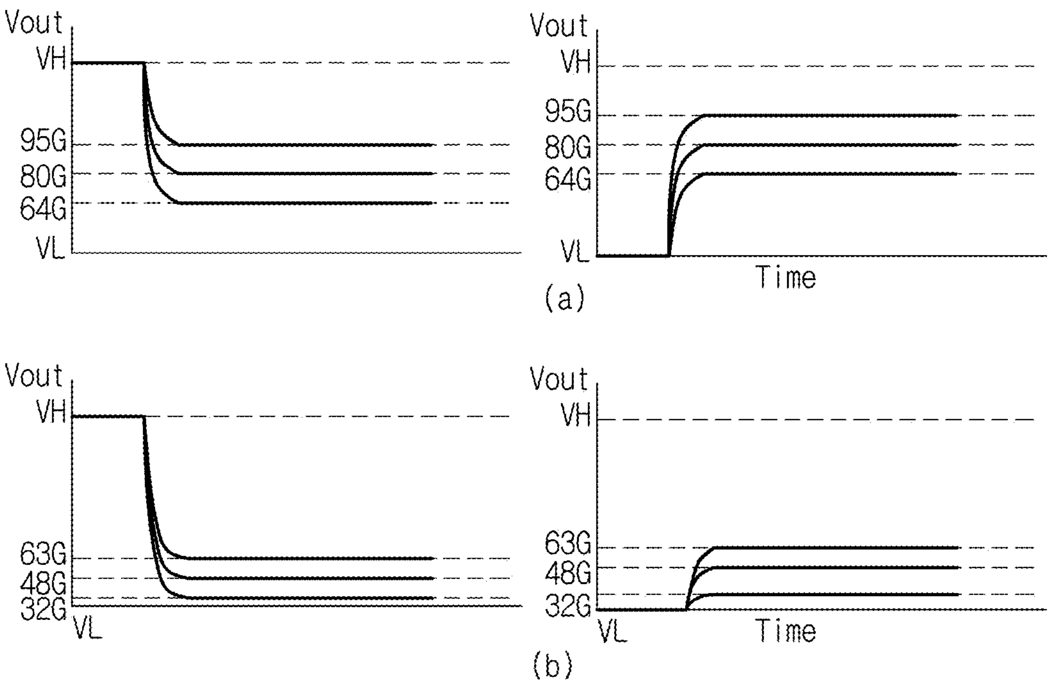
FIG. 10 shows graphs illustrating the input and output signals of the digital-to-analog converter in FIG. 8.

FIG. 8 is a diagram illustrating the structure of a slew rate controller according to a second embodiment of the present disclosure, FIG. 9 is a diagram illustrating the structure of the slew rate control signal generator in FIG. 8, and FIG. 10 shows diagrams illustrating the input and output signals of the digital-to-analog converter in FIG. 8.

Referring to FIG. 8, compared to the first embodiment, in the slew rate controller 343 according to the second embodiment, the pull-up switching element SWup and the pull-down switching element SWdown are omitted. Additionally, the slew rate control signals VN and VP can have variable voltage levels.

For example, the slew rate control signals VN and VP can have different voltage levels depending on the grayscale value indicated by the image data DATA. To vary the voltage levels of the slew rate control signals VN and VP, the slew rate controller 343 can include slew rate control signal generators 3431 and 3432.

Referring to FIG. 9, the slew rate control signal generators 3431 and 3432 can include a first slew rate control signal generator 3431 that generates the first slew rate control signal VN and a second slew rate control signal generator 3432 that generates the second slew rate control signal VP. Each slew rate control signal generator 3431 and 3432 can include switching elements SWN1 to SWN4, SWP1 to SWP4, each connected to input voltages with different voltage levels. The switching elements SWN1 to SWN4, SWP1 to SWP4 can be turned on according to the switching control signal SWC and output one of the input voltages as the slew rate control signal VN or VP.

The input voltages can include the high-potential voltage VDD and the low-potential voltage VSS. Additionally, the input voltages can include gamma voltages corresponding to at least one grayscale value. In the embodiment of the present disclosure, the input voltages of the first slew rate control signal generator 3431 can include gamma voltages G87 and G52 corresponding to grayscale values 87 and 52, respectively, and the input voltages of the second slew rate control signal generator 3432 can include gamma voltages G72 and G40 corresponding to grayscale values 72 and 40, respectively, but are not limited thereto.

In this embodiment of the present disclosure, the first switching element SWN1 of the first slew rate control signal generator 3431 can be connected to the high-potential voltage VDD, the second switching element SWN2 can be connected to the gamma voltage G87 corresponding to grayscale value 87, the third switching element SWN3 can be connected to the gamma voltage G52 corresponding to grayscale value 52, and the fourth switching element SWN4 can be connected to the low-potential voltage VSS. Additionally, the first switching element SWP1 of the second slew rate control signal generator 3432 can be connected to the high-potential voltage VDD, the second switching element SWP2 can be connected to the gamma voltage G72 corresponding to grayscale value 72, the third switching element SWP3 can be connected to the gamma voltage G40 corresponding to grayscale value 40, and the fourth switching element SWP4 can be connected to the low-potential voltage VSS.

Through the switching control signal SWC, the slew rate control signal generators 3431 and 3432 can be controlled to turn on one of the switching elements SWN1 to SWN4, SWP1 to SWP4 based on the grayscale value of the image data DATA. For example, when the grayscale value of the image data DATA falls within the first grayscale range, the first switching elements SWN1 and SWP1 of the slew rate control signal generators 3431 and 3432 can turn on, and when the grayscale value falls within a second grayscale range lower than the first, the second switching elements SWN2 and SWP2 can turn on, and when the grayscale value falls within a third grayscale range lower than the second, the third switching elements SWN3 and SWP3 can turn on, and when the grayscale value falls within a fourth grayscale range lower than the third, the fourth switching elements SWN4 and SWP4 can turn on.

Here, the first grayscale range can include grayscale values greater than 87, the second grayscale range can include grayscale values 87 and 72, the third grayscale range can include grayscale values 52 and 40, and the fourth grayscale range can include grayscale values smaller than 40.

The pull-up transistor Tup and pull-down transistor Tdown can have their gate electrode voltages varied depending on the slew rate control signals VN and VP applied through the switching elements SWN1 to SWN4 and SWP1 to SWP4. The magnitude of the charging current and discharging current applied through the pull-up transistor Tup and pull-down transistor Tdown can be varied according to the gate voltage.

When one set of the switching elements SWN1 to SWN4 and SWP1 to SWP4 is turned on, corresponding to the grayscale value of the image data DATA (or the output voltage Vout), the slew rate of the output voltage Vout can be controlled depending on the charging current flowing through the pull-up transistor Tup and the discharging current flowing through the pull-down transistor Tdown.

In the case where the output voltage Vout changes in the first grayscale range, the first switching elements SWN1 and SWP1 can be turned on, and the high-potential voltage VDD can be applied to the pull-up transistor Tup and pull-down transistor Tdown. As a result, the gate-source voltage of the pull-up transistor Tup can become maximum, and the gate-source voltage of the pull-down transistor Tdown can become minimum. Consequently, in the first grayscale range, the magnitude of the charging current flowing through the pull-up transistor Tup can be maximum, and the magnitude of the discharging current flowing through the pull-down transistor Tdown can be minimum, resulting in a maximum rising slew rate and a minimum falling slew rate of the output voltage Vout. As a result, when the grayscale range increases to the first grayscale range, the output voltage Vout can rise quickly.

Referring to (a) of FIG. 10, when the grayscale value of the image data DATA changes to the second grayscale range, and the second switching elements SWN2 and SWP2 are turned on, the gamma voltage G87 corresponding to the grayscale value 87 can be applied to the pull-up transistor Tup, and the gamma voltage G72 corresponding to the grayscale value 72 can be applied to the pull-down transistor Tdown. As a result, the gate-source voltage of the pull-up transistor Tup can decrease compared to the previous state, and the gate-source voltage of the pull-down transistor Tdown can increase compared to the previous state. Consequently, in the second grayscale range, the magnitude of the charging current flowing through the pull-up transistor Tup can decrease, and the magnitude of the discharging current flowing through the pull-down transistor Tdown can increase, resulting in a decrease in the rising slew rate of the output voltage Vout compared to the first grayscale range, and an increase in the falling slew rate. As a result, when the grayscale range increases to the second grayscale range, the output voltage Vout can increase at a relatively slow rate, and when the grayscale range decreases to the second grayscale range, the output voltage Vout can decrease at a relatively fast rate.

Referring to (b) of FIG. 10, when the grayscale value of the image data DATA changes to the third grayscale range, and the third switching elements SWN3 and SWP3 are turned on, the gamma voltage G52 corresponding to the grayscale value 52 can be applied to the pull-up transistor Tup, and the gamma voltage G40 corresponding to the grayscale value 40 can be applied to the pull-down transistor Tdown. As a result, the gate-source voltage of the pull-up transistor Tup can decrease further compared to the previous state, and the gate-source voltage of the pull-down transistor Tdown can increase further compared to the previous state. Consequently, in the third grayscale range, the magnitude of the charging current flowing through the pull-up transistor Tup can decrease further, and the magnitude of the discharging current flowing through the pull-down transistor Tdown can increase further, resulting in a decrease in the rising slew rate of the output voltage Vout compared to the second grayscale range, and an increase in the falling slew rate. As a result, when the grayscale range increases to the third grayscale range, the output voltage Vout can increase at a relatively slower rate, and when the grayscale range decreases to the third grayscale range, the output voltage Vout can decrease at a relatively faster rate.

When the fourth switching elements SWN4 and SWP4 are turned on, the low-potential voltage VSS can be applied to the pull-up transistor Tup and the pull-down transistor Tdown. As a result, the gate-source voltage of the pull-up transistor Tup can be minimized or reduced, and the gate-source voltage of the pull-down transistor Tdown can be maximized or increased. Consequently, in the fourth grayscale range, the magnitude of the charging current flowing through the pull-up transistor Tup can be minimized or reduced, and the magnitude of the discharging current flowing through the pull-down transistor Tdown can be maximized or increased, resulting in a minimum rising slew rate of the output voltage Vout and a maximum falling slew rate. As a result, when the grayscale range decreases to the fourth grayscale range, the output voltage Vout can decrease rapidly.

In this manner, the voltage levels of the slew rate control signals VN and VP can be variable. As the voltage levels of the slew rate control signals VN and VP are varied, the gate voltage of the pull-up transistor Tup or the pull-down transistor Tdown can also vary. As the gate-source voltage increases, the magnitude of the charging current or discharging current flowing through the pull-up transistor Tup or the pull-down transistor Tdown can increase. In the high grayscale range, as the grayscale value increases, the gate-source voltage of the pull-up transistor Tup can increase, resulting in an increase in the rising slew rate of the output voltage Vout corresponding to the increase in the grayscale range, and a decrease in the falling slew rate of the output voltage Vout corresponding to the decrease in the grayscale range. Additionally, in the high grayscale range, as the grayscale value decreases, the gate-source voltage of the pull-up transistor Tup can decrease, resulting in a decrease in the rising slew rate of the output voltage Vout corresponding to the increase in the grayscale range, and an increase in the falling slew rate of the output voltage Vout corresponding to the decrease in the grayscale range.

In the low grayscale range, as the grayscale value decreases, the gate-source voltage of the pull-down transistor Tdown can increase, resulting in a faster increase in the falling slew rate of the output voltage Vout corresponding to the decrease in the grayscale range, and a decrease in the rising slew rate of the output voltage Vout corresponding to the increase in the grayscale range. Additionally, in the low grayscale range, as the grayscale value increases, the gate-source voltage of the pull-down transistor Tdown can decrease, resulting in an increase in the falling slew rate of the output voltage Vout corresponding to the decrease in the grayscale range, and a decrease in the rising slew rate of the output voltage Vout corresponding to the increase in the grayscale range.

In such an embodiment of the present disclosure, the switching control signal SWC can be transmitted as a single packet along with the image data DATA. For example, the switching control signal SWC can be transmitted through the most significant bit of the packet in which the image data DATA is sent. In one embodiment of the present disclosure, the switching control signal SWC can be transmitted through n most significant bits, wherein the switching control signal SWC, using n bits, can control the 2n switching elements SWN1 to SWN4 and SWP1 to SWP4 included in the corresponding slew rate control signal generators 3431 and 3432.

In the embodiment of the present disclosure, the switching control signal SWC is composed of two bits (D[9], D[8]), and is configured to control the four switching elements SWN1 to SWN4 and SWP1 to SWP4 included in each slew rate control signal generator 3431 and 3432. For example, the first switching elements SWN1 and SWP1 can be turned on for the two bits of the switching control signal SWC being '11', the second switching elements SWN2 and SWP2 can be turned on for the two bits being '10', the third switching elements SWN3 and SWP3 can be turned on for the two bits '01', and the fourth switching elements SWN4 and SWP4 can be turned for the two bits being '00'. However, the embodiment of the present disclosure is not limited thereto.

In this embodiment of the present disclosure, the slew rate controller 343 can control the slew rate through a single transistor pair (Tup, Tdown), thereby reducing the area occupied by the slew rate controller 343 and preventing or reducing an increase in the parasitic capacitance of the output stage. Additionally, by controlling the output voltage Vout through the increase and decrease of charging and discharging currents, the output voltage Vout is not overcharged.

Figure 11:
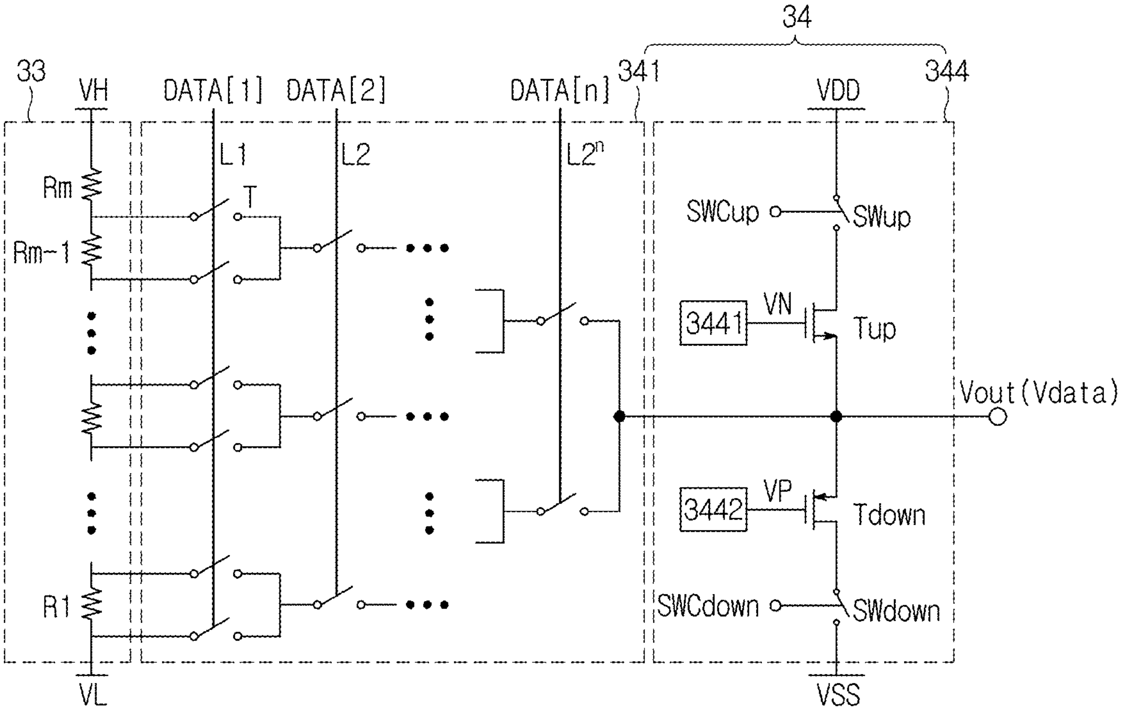
FIG. 11 is a diagram illustrating the structure of a slew rate controller according to a third embodiment of the present disclosure.

FIG. 11 is a diagram illustrating the structure of a slew rate controller according to a third embodiment of the present disclosure.

Referring to FIG. 11, the slew rate controller 344 according to the third embodiment can include the structures of both the slew rate controller 342 according to the first embodiment and the slew rate controller 343 according to the second embodiment. In other words, the slew rate controller 344 includes a pull-up switching element SWup and a pull-down switching element SWdown, and the slew rate control signals VN, VP can have their voltage levels varied according to the gray scale values of the image data DATA through the slew rate control signal generating sections 3441 and 3442.

In this embodiment, the pull-up transistor Tup and the pull-down transistor Tdown can generate charging or discharging currents through the pull-up switching element SWup and the pull-down switching element SWdown that are turned on/off by the switching control signals SWCup and SWCdown, and the magnitude of the charging or discharging current can be controlled according to the voltage levels of the variable slew rate control signals VN and VP. Therefore, the compensation range can be controlled more effectively while preventing or reducing overcharging of the output voltage Vout.

Figure 12:
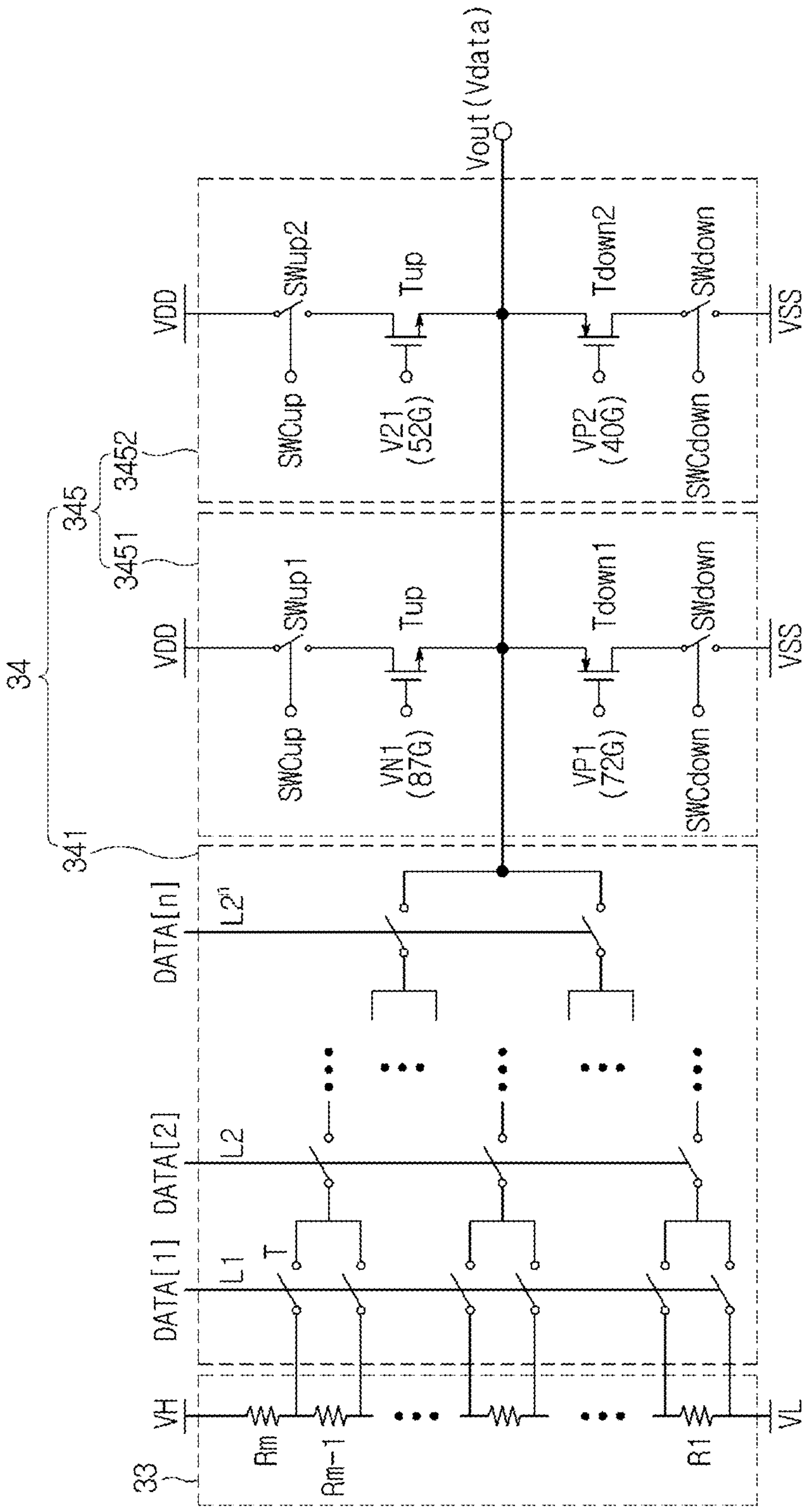
FIG. 12 is a diagram illustrating the structure of a slew rate controller according to a fourth embodiment of the present disclosure.
Figure 13:
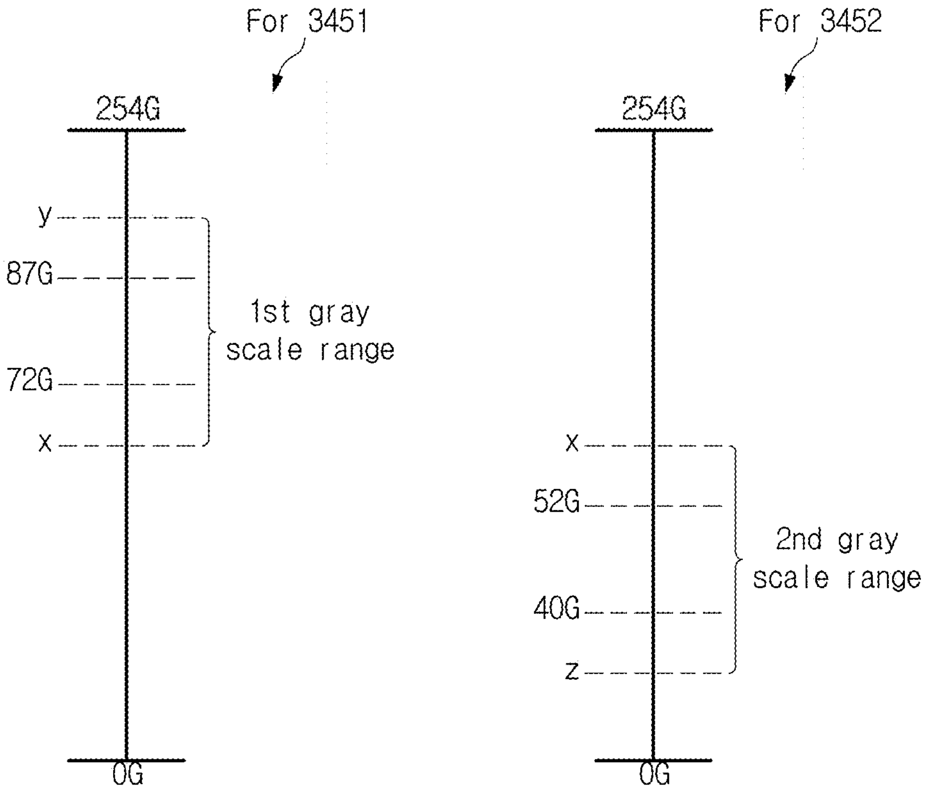
Figure 14:
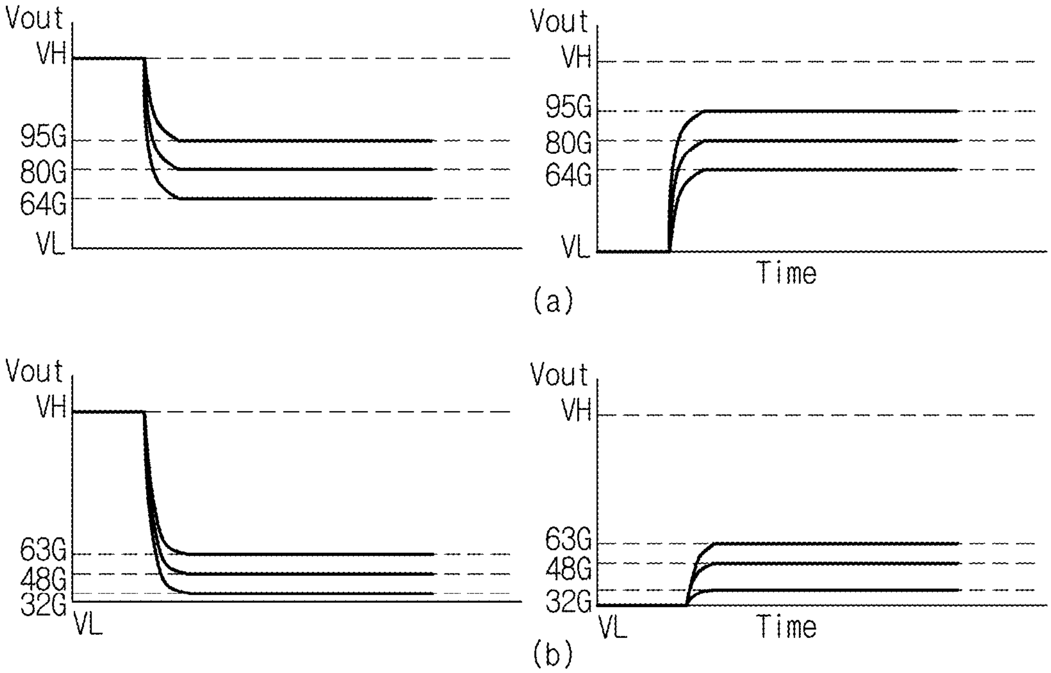
FIG. 14 shows graphs illustrating the input and output signals of the digital-to-analog conversion section in FIG. 12.

FIG. 12 is a diagram illustrating the structure of a slew rate controller according to a fourth embodiment of the present disclosure. FIG. 13 is a diagram for explaining the grayscale range in which the switching elements in FIG. 12 are turned on. FIG. 14 shows diagrams illustrating the input and output signals of the digital-to-analog converter in FIG. 12.

Referring to FIG. 12, the slew rate controller 345 according to the fourth embodiment can include multiple instances of the slew rate controller 344 according to the first embodiment. For example, the slew rate controller 345 can include a first slew rate controller 3451 and a second slew rate controller 3452, both having the same or substantially same configuration as the slew rate controller 342 according to the first embodiment.

The first slew rate controller 3451 can include a first pull-up transistor Tup1 connected between a high-potential voltage VDD and the output terminal, and a first pull-down transistor Tdown1 connected between the output terminal and a low-potential voltage VSS. The second slew rate controller 3452 can include a second pull-up transistor Tup2 connected between the high-potential voltage VDD and the output terminal, and a second pull-down transistor Tdown2 connected between the output terminal and the low-potential voltage VSS. The first pull-up transistor Tup1 and the first pull-down transistor Tdown1 are connected in series between the high-potential voltage VDD and the low-potential voltage VSS, and the second pull-up transistor Tup2 and the second pull-down transistor Tdown2 are also connected in series between the high-potential voltage VDD and the low-potential voltage VSS. The first slew rate controller 3451 and the second slew rate controller 3452 are connected in parallel.

The first pull-up transistor Tup1 is connected to the first slew rate control signal VN1, and the second pull-up transistor Tup2 is connected to the second slew rate control signal VN2. The first pull-down transistor Tdown1 is connected to the first slew rate control signal VP1, and the second pull-down transistor Tdown2 is connected to the second slew rate control signal VP2.

Referring to FIG. 13, the first slew rate controller 3451 can be configured to control the slew rate when the gray value of the image data DATA falls within the first gray range (e.g., from x to y), and the second slew rate controller 3452 can be configured to control the slew rate when the gray value of the image data DATA falls within the second gray range (e.g., from z to x), which is lower than the first gray range.

To achieve this, the switching elements SWup1, SWdown1 of the first slew rate controller 3451 can be turned on within the first gray range, and the switching elements SWup2, SWdown2 of the second slew rate controller 3452 can be turned on within the second gray range.

The pull-up/pull-down transistors Tup1, Tdown1 of the first slew rate controller 3451 can receive pre-set gray voltages G87, G72 within the high gray voltage range at their gate electrodes, and the pull-up/pull-down transistors Tup2, Tdown2 of the second slew rate controller 3452 can receive pre-set gray voltages G52, G40 within the low gray voltage range at their gate electrodes.

The pull-up transistor Tup1 and the pull-down transistor Tdown1 of the first slew rate controller 3451 can control the amount of charging and discharging current within the first gray range, thus controlling the output voltage Vout. Similarly, the pull-up transistor Tup2 and the pull-down transistor Tdown2 of the second slew rate controller 3452 can control the amount of charging and discharging current within the low gray range, thereby controlling the output voltage Vout.

Referring to (a) of FIG. 14, when the output voltage Vout corresponds to a gray level within the first gray range, the switching elements SWup1 and SWdown1 of the first slew rate controller 3451 can be turned on, and the gamma voltage G87 corresponding to the gray value 87 can be applied through the pull-up transistor Tup, while the gamma voltage G72 corresponding to the gray value 72 can be applied through the pull-down transistor Tdown. For example, the first gray range can be from 64 G to 100 G.

The gate-source voltage of the pull-up transistor Tup and the pull-down transistor Tdown can vary according to the gamma value of the image data DATA, and accordingly, the magnitudes of the charging current and discharging current can be variable. The output voltage Vout can be quickly charged or discharged to the target voltage depending on the charging and discharging currents.

Referring to (b) of FIG. 14, when the output voltage Vout corresponds to a gray level within the second gray range, the switching elements SWup1 and SWdown1 of the first slew rate controller 3451 can be turned on, and the gamma voltage G52 corresponding to the gray value 52 can be applied through the pull-up transistor Tup, while the gamma voltage G40 corresponding to the gray value 40 can be applied through the pull-down transistor Tdown. For example, the first gray range can be from 30 G to 63 G.

The gate-source voltage of the pull-up transistor Tup and the pull-down transistor Tdown can vary according to the gamma value of the image data DATA, and accordingly, the magnitudes of the charging current and discharging current can be variable. The rising slew rate of the output voltage Vout can increase or decrease depending on the charging current, thereby quickly charging to the target voltage or controlling a relatively slower charging speed. The falling slew rate of the output voltage Vout can increase or decrease depending on the discharging current, thereby quickly discharging to the target voltage or controlling a relatively slower discharging speed.

The digital-to-analog converter and the driving circuit of a display device including the same according to the embodiments of the present disclosure are advantageous for improving the slew rate of the data driver by utilizing a charging path and a discharging path.

The digital-to-analog converter and the driving circuit of a display device including the same according to the embodiments of the present disclosure are advantageous for preventing or reducing image quality degradation caused by the slew rate of the data driver in high-resolution, high-refresh-rate display devices.

The digital-to-analog converter and the driving circuit of a display device including the same according to the embodiments of the present disclosure are advantageous for improving the slew rate of the data driver while reducing or minimizing increases in size and power consumption.

Although the embodiments of the present disclosure have been described with reference to the attached drawings, those skilled in the art will appreciate that the technical configuration of the present disclosure can be implemented in other specific forms without changing the technical spirit or essential characteristics of the disclosure. Therefore, it should be understood that the embodiments of the present disclosure described above are exemplary and not limited in all respects. Furthermore, the scope of the present disclosure is defined by the claims set forth below, rather than the detailed description above. In addition, it should be understood that all modifications or variations derived from the meaning and scope of the claims and their equivalent concept are included within the scope of the this disclosure.

What is claimed is:

1. A digital-to-analog converter comprising:

a decoder configured to select one of a plurality of gamma voltages corresponding to a grayscale value of image data input from an external device, and output the selected gamma voltage to an output terminal of the decoder as a data voltage corresponding to the grayscale value of the image data to be applied to a pixel through a data line; and a slew rate controller connected to the output terminal of the decoder, wherein the slew rate controller comprises:

a pull-up transistor connected between a high-potential voltage and the output terminal, with a gate electrode configured to receive a first slew rate control signal; and a pull-down transistor connected between a low-potential voltage and the output terminal, with a gate electrode configured to receive a second slew rate control signal, and wherein the pull-up transistor and the pull-down transistor are controlled to be selectively turned on or off based on the grayscale value of the image data to generate a charging current or a discharging current, respectively, thereby controlling a slew rate of the data voltage at the output terminal.

2. The digital-to-analog converter of claim 1, wherein the slew rate controller further comprises:

a pull-up switching element connected between the high-potential voltage and the pull-up transistor; and a pull-down switching element connected between the low-potential voltage and the pull-down transistor.

3. The digital-to-analog converter of claim 2, wherein the pull-up switching element is turned on based on the grayscale value being within a first grayscale range, the pull-down switching element is turned on based on the grayscale value being within a second grayscale range, the first grayscale range comprises grayscale values greater than a predetermined threshold among all grayscale values, and the second grayscale range comprises grayscale values less than the predetermined threshold among all grayscale values.

4. The digital-to-analog converter of claim 3, wherein upon the pull-up switching element being turned on, the charging current is applied to the output terminal through the pull-up transistor being in a turned-on state, and upon the pull-down switching element being turned on, the discharging current is leaked from the output terminal through the pull-down transistor being in a turned-on state.

5. The digital-to-analog converter of claim 3, wherein the pull-up switching element comprises a transistor connected between the high-potential voltage and the pull-up transistor, and configured to be turned on in the first grayscale range, and the pull-down switching element comprises a transistor connected between the low-potential voltage and the pull-down transistor, and configured to be turned on in the second grayscale range.

6. The digital-to-analog converter of claim 1, wherein the first slew rate control signal and the second slew rate control signal vary in correspondence with the grayscale value.

7. The digital-to-analog converter of claim 6, wherein the slew rate controller further comprises:

a first slew rate control signal generator configured to generate the first slew rate control signal; and a second slew rate control signal generator configured to generate the second slew rate control signal.

8. The digital-to-analog converter of claim 7, wherein the first slew rate control signal generator comprises a plurality of first switching elements respectively connected between a plurality of input voltages having different voltage levels and an output terminal applied with the first slew rate control signal, the second slew rate control signal generator comprises a plurality of second switching elements respectively connected between a plurality of input voltages having different voltage levels and an output terminal applied with the second slew rate control signal, and the plurality of first switching elements and the plurality of second switching elements are controlled to be selectively turned on based on the grayscale value of the image data.

9. The digital-to-analog converter of claim 8, wherein the plurality of input voltages comprise at least one of the high-potential voltage, the low-potential voltage, and the plurality of gamma voltages.

10. The digital-to-analog converter of claim 1, wherein the slew rate controller further comprises:

a pull-up switching element connected between the high-potential voltage and the pull-up transistor;

a pull-down switching element connected between the low-potential voltage and the pull-down transistor;

a first slew rate control signal generator configured to generate the first slew rate control signal; and a second slew rate control signal generator configured to generate the second slew rate control signal.

11. The digital-to-analog converter of claim 10, wherein the first slew rate control signal and the second slew rate control signal have a voltage level corresponding to one of the plurality of gamma voltages.

12. The digital-to-analog converter of claim 1, wherein the slew rate controller comprises:

a first slew rate controller comprising a first pull-up transistor and a first pull-down transistor; and a second slew rate controller connected in parallel with the first slew rate controller, and comprising a second pull-up transistor and a second pull-down transistor.

13. The digital-to-analog converter of claim 12, wherein the first slew rate controller further comprises a first pull-up switching element connected between the high-potential voltage and the pull-up transistor and a first pull-down switching element connected between the low-potential voltage and the pull-down transistor, and the second slew rate controller further comprises a second pull-up switching element connected between the high-potential voltage and the pull-up transistor and a second pull-down switching element connected between the low-potential voltage and the pull-down transistor.

14. The digital-to-analog converter of claim 13, wherein upon the grayscale value being within a first grayscale range, the first pull-up switching element and the first pull-down switching element are turned on, upon the grayscale value being within a second grayscale range, the second pull-up switching element and the second pull-down switching element are turned on, the first grayscale range comprises grayscale values greater than a predetermined threshold among all grayscale values, and the second grayscale range comprises grayscale values less than the predetermined threshold among all grayscale values.

15. The digital-to-analog converter of claim 1, wherein the slew rate controller further comprises:

a pull-up switching element connected in series with the pull-up transistor between the high-potential voltage and the output terminal; and a pull-down switching element connected in series with the pull-down transistor between the low-potential voltage and the output terminal.

16. A driving circuit of a display device, the driving circuit comprising:

a register configured to sequentially sample and output bits of image data received from a timing controller;

a latch configured to latch and output the image data received from the register;

a gamma voltage generator configured to divide a gamma reference voltage to generate a plurality of gamma voltages; and a digital-to-analog converter configured to select one of the plurality of gamma voltages corresponding to a grayscale value of the image data, and output the selected gamma voltage through an output terminal as a data voltage corresponding to the grayscale value of the image data to be applied to a pixel through a data line, wherein the digital-to-analog converter comprises:

a decoder configured to select one of the plurality of gamma voltages corresponding to the grayscale value of the image data, and output the selected gamma voltage to the output terminal; and a slew rate controller connected to the output terminal of the decoder, wherein the slew rate controller comprises:

a pull-up transistor connected between a high-potential voltage and the output terminal, with a gate electrode configured to receive a first slew rate control signal; and a pull-down transistor connected between a low-potential voltage and the output terminal, with a gate electrode configured to receive a second slew rate control signal, and wherein the pull-up transistor and the pull-down transistor are controlled to turn on and off based on the grayscale value of the image data to generate a charging current and a discharging current, respectively, thereby controlling a slew rate of the data voltage at the output terminal.

17. The driving circuit of claim 16, wherein the slew rate controller further comprises:

a pull-up switching element connected between the high-potential voltage and the pull-up transistor; and a pull-down switching element connected between the low-potential voltage and the pull-down transistor.

18. The driving circuit of claim 16, wherein the first slew rate control signal and the second slew rate control signal vary in correspondence with the grayscale value.

19. The driving circuit of claim 18, wherein the slew rate controller further comprises:

a first slew rate control signal generator configured to generate the first slew rate control signal; and a second slew rate control signal generator configured to generate the second slew rate control signal.

20. The driving circuit of claim 19, wherein the first slew rate control signal generator comprises a plurality of first switching elements respectively connected between a plurality of input voltages having different voltage levels and an output terminal applied with the first slew rate control signal, the second slew rate control signal generator comprises a plurality of second switching elements respectively connected between a plurality of input voltages having different voltage levels and an output terminal applied with the second slew rate control signal, and the plurality of first switching elements and the plurality of second switching elements are controlled to be selectively turned on based on the grayscale value of the image data.

* * * * *